(12) United States Patent
Chang

(10) Patent No.: US 6,207,566 B1
(45) Date of Patent: Mar. 27, 2001

(54) METHOD FOR FORMING A METAL PLUG ON A SEMICONDUCTOR WAFER

(75) Inventor: Ching-I Chang, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/452,105

(22) Filed: Dec. 2, 1999

(51) Int. Cl.[7] .................... H01L 21/4763; H01L 21/44
(52) U.S. Cl. ...................... 438/672; 438/622; 438/637; 438/675
(58) Field of Search ..................... 438/675, 672, 438/667–669, 256, 348, 622, 624, 631, 634, 637, 642, 657, 647, 687, 688, 684

(56) References Cited

U.S. PATENT DOCUMENTS

| 5,766,974 | * | 6/1998 | Sardella et al. | 438/624 |
| 5,801,093 | * | 9/1998 | Lin | 438/624 |
| 5,843,839 | * | 12/1998 | Ng | 438/637 |

* cited by examiner

Primary Examiner—Charles Bowers
Assistant Examiner—Thanhha Pham
(74) Attorney, Agent, or Firm—Winston Hsu

(57) ABSTRACT

The present invention provides a method for forming a metal plug on a semiconductor wafer. The semiconductor wafer comprises a substrate, and at least one first conductive layer installed in a predetermined area on the surface of the substrate. The method involves first forming a dielectric layer with a thickness of less than 1000 Angstroms (Å) on the surface of the substrate, then forming a hole above the first conductive layer which passes through the dielectric layer and reaches the first conductive layer. A second conductive layer is uniformly formed over the dielectric layer and the hole. A mask is formed on the surface of the second conductive layer which is above the hole of the dielectric layer to define the position of a metal plug. Finally, a second dry etching process removes the second conductive layer which is not covered by the mask, the remaining second conductive layer under the mask being the metal plug, and the mask is then completely removed.

6 Claims, 13 Drawing Sheets

METHOD FOR FORMING A METAL PLUG ON A SEMICONDUCTOR WAFER

BACKGROUND OF THE INVENTION

1. Field of the Invention

The present invention relates to a method for forming a metal plug on a semiconductor wafer.

2. Description of the Prior Art

On a semiconductor wafer there is always a dielectric layer between the metallic layers that is used to isolate and protect the conductive lines on the semiconductor wafer. In order to electrically connect every metallic layer to form a complete circuit, it is necessary to form a metal plug between metallic layers that serves as an electrical path connecting the conductive lines of each layer. Improving the quality of the process for forming metal plugs is a very important issue in semiconductor processing research.

Please refer to FIG. 1 to FIG. 9. FIG. 1 to FIG. 9 are cross-sectional diagrams of the process of forming a metal plug 46 on the semiconductor wafer 10 according to the prior art. As shown in FIG. 1, the semiconductor wafer 10 comprises a substrate 12, a field oxide layer 14 installed in a predetermined area on the surface of the substrate 12, two polysilicon layers 16 separately installed over the substrate and the field oxide layer 14, a dielectric layer 18 installed on the surface of the substrate 12 and covering the polysilicon layers serving as an insulation layer between the two polysilicon layers 16, two via holes 20 installed in the dielectric layer 18 above the polysilicon layers 16, and a conductive layer 22 installed over the dielectric layer 18 and filling the via holes 20.

The prior art method of forming a metal plug is to first perform a lithographic process to form a photo-resist layer 24 on the conductive layer 22. As show in FIG. 1, the photo-resist layer 24 comprises three opening 26 to define the positions of two contact plugs. As shown in FIG. 2, a dry etching process is performed to etch the conductive layer 22 under the openings 26 down to the surface of the dielectric layer 18. As shown in FIG. 3, the photo-resist layer 24 is then completely removed. The remaining conductive layer 22 will form two contact plugs 28 that connect between the polysilicon layers 16 and a subsequent metallic layer (not shown).

After completing the contact plugs 28, a planarization process is performed. First, a plasma enhanced chemical vapor deposition (PECVD) process is performed to form a dielectric layer 30 of silicon dioxide ($SiO_2$) to completely cover the surfaces of the conductive layer 22 and the dielectric layer 18, as shown in FIG. 4. A spin-on glass (SOG) process is then performed to form an SOG layer 32 on the surface of the dielectric layer 30, filling the gaps between the contact plugs 28. As shown in FIG. 5, an etch back process uniformly removes part of the SOG layer 32 to reduce its thickness. Then, a PECVD process forms a dielectric layer 34 of silicon dioxide on the surface of the semiconductor wafer 10, completing the planarization process of the semiconductor wafer 10. The dielectric layer 30, SOG layer 32, and the dielectric layer 34 form a sandwich-type structure that guarantees the physical and chemical characteristics of the SOG layer 32.

As shown in FIG. 6, a lithographic process is performed to form a photo-resist layer 36 above the dielectric layer 34, the photo-resist layer 36 comprising two openings 38 that are used to define the position of a metal plug 46. As shown in FIG. 7, a wet etching process, along the openings 38, etches the dielectric layer 34 downward. Two bowl-like via holes 40 are formed because of the isotropic nature of the wet etching process. As shown in FIG. 8, an anisotropic etching process is performed to etch downwards through the dielectric layer 34, SOG layer 32, and the dielectric layer 30 so as to form two via holes 42 below the via holes 40. The via holes 40 and via holes 42 together form a wineglass-shaped structure. As shown in FIG. 9, the photo-resist layer 36 is then completely removed. A metallic conductive layer is formed on the dielectric layer 34, filling the via holes 40 and via holes 42 to form a metal plug 46.

The prior art method of forming the metal plug 46 requires first forming via holes 40 and via holes 42 and then filling them with metal to electrically connect the conductive layer 44 to the conductive layers 22. The prior art method of forming the metal plug 46 has several shortcomings, as follows:

(1) The via hole 42 has a large aspect ratio and is therefore not easy to fill with metal. Voids often form in the metal plug, affecting its electrical performance. This problem becomes more serious in sub-micron processes.

(2) The diameter of each via hole is getting smaller with the reduction of component sizes. When performing the lithographic process to define each via hole, misalignment can easily occur. To completely fill the via holes, most via holes possess a wineglass-shaped structure. However, the bowl-like structure of the via hole reduces misalignment tolerances, and it is easy to destroy other components and cause component shorts when forming the bowl-like structure.

(3) Currently, the metal plug 46 is mostly formed using tungsten plug (W-plug) technology. Although tungsten has nice step coverage abilities that resolve the problem of gap filling, it increases both the resistance of the metal plug 46 and the production cycle time. Furthermore, the tungsten plug technology is not very economical.

(4) When forming the via hole 42, the polymers produced for etching the SOG layer 32, and the dielectric layers 30, 34 cannot be completely removed, which may further complicate the problem of filling metal into the via holes.

(5) The prior art method performs a planarization process on the surface of the semiconductor wafer 10 to increase the accuracy of the follow-up metal conductive lines processes. However, the SOG layer 32 of the planarization process can absorb moisture. When filling metal into the via holes 40, 42, the moisture may leak into the via holes 40, 42 and adversely affect the process, resulting in so-called poison vias.

(6) When using the tungsten plug technology to form the metal plug 46, because tungsten has poor adhesion to other materials, a titanium nitride (TiN) layer or an alloy layer of titanium and tungsten will usually be added between the tungsten plug and the follow-up metal to be used as a barrier layer to promote the adhesion of the tungsten. However, this barrier layer increases the resistance of the metal plug 46 and affects the performance of the entire component.

SUMMARY OF THE INVENTION

It is therefore a primary objective of the present invention to provide a method for forming a metal plug on a semiconductor wafer to solve the above mentioned problems.

In a preferred embodiment, the present invention provides a method for forming a metal plug on a semiconductor wafer. The semiconductor wafer comprises a substrate, and at least one first conductive layer installed in a predetermined area on the surface of the substrate. The method first forms a dielectric layer with a thickness of less than 1000 Angstroms (Å) on the surface of the substrate, and then forms a hole above the first conductive layer which passes through the dielectric layer and reaches the first conductive layer. A second conductive layer is then formed uniformly over the dielectric layer and the hole. A mask is formed on the surface of the second conductive layer that is above the hole of the dielectric layer to define the position of the metal plug. Finally, a second dry etching process is performed to remove the second conductive layer which is not covered by the mask, the remaining second conductive layer under the mask being the metal plug, and removing the mask completely.

It is an advantage that the present invention method for forming a metal plug can improve the yield of the metal plug process and improve the quality and the electrical performance of the metal plug, as well as reducing production times and costs.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
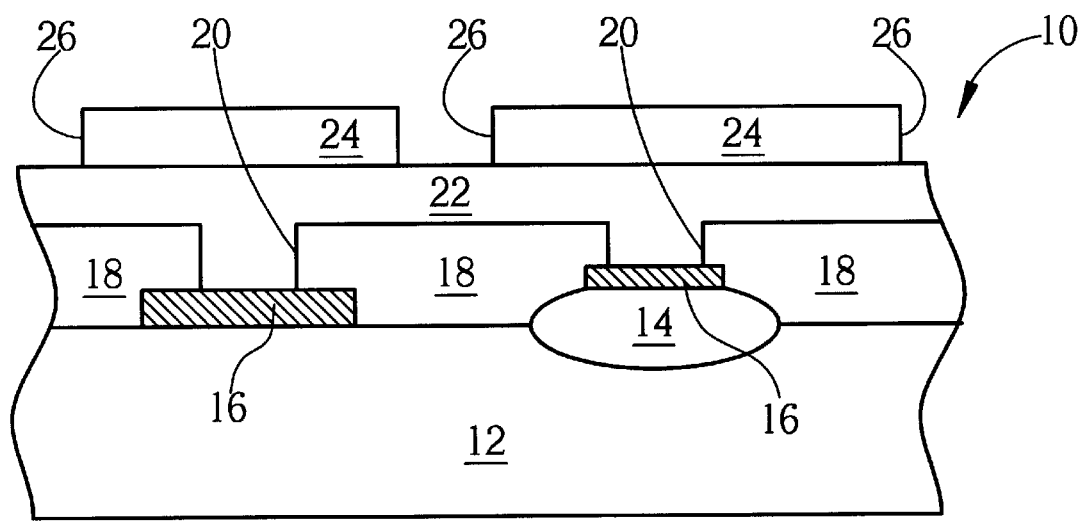
FIG. 1 to FIG. 9 are cross-sectional diagrams of a process of forming a metal plug according to the prior art.
Figure 2:
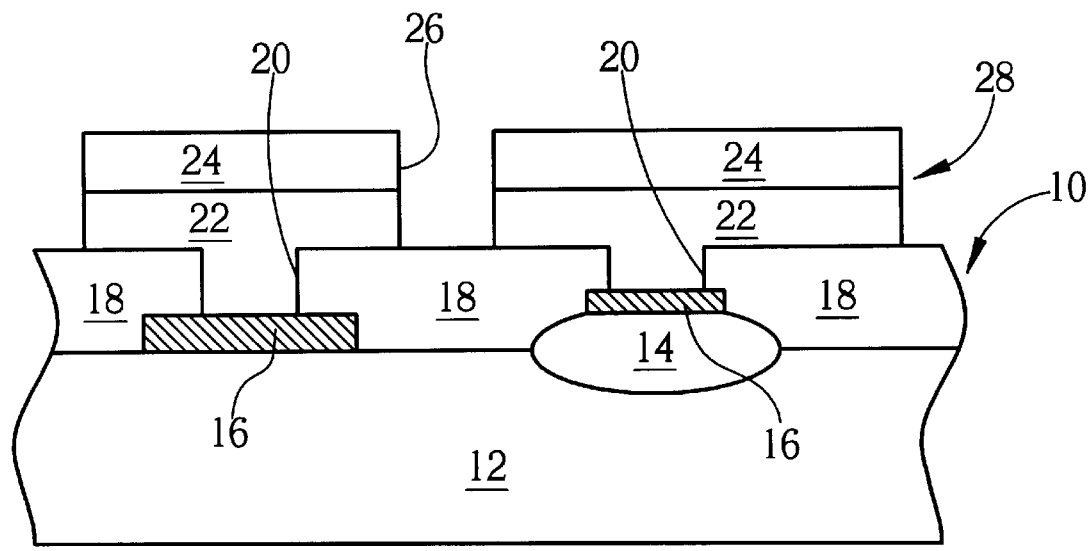
Figure 3:
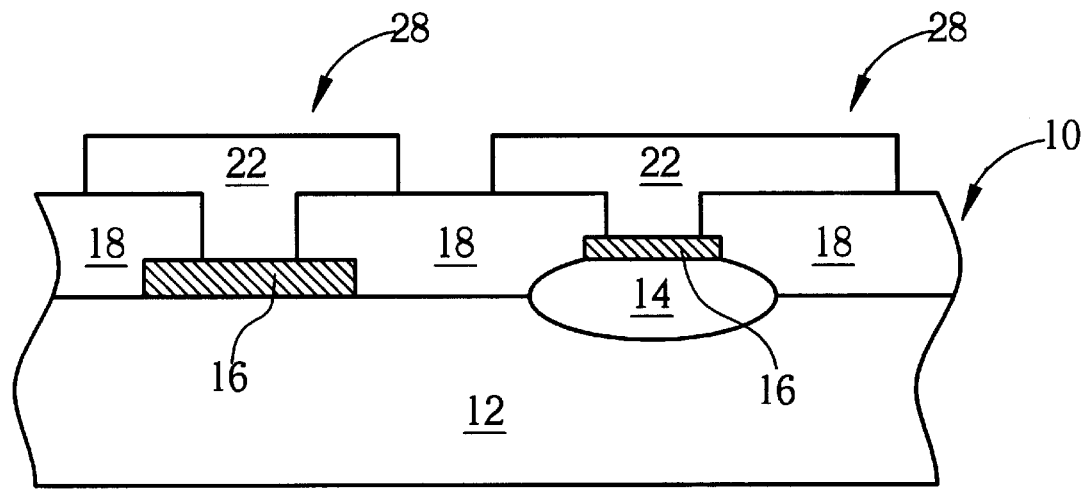
Figure 4:
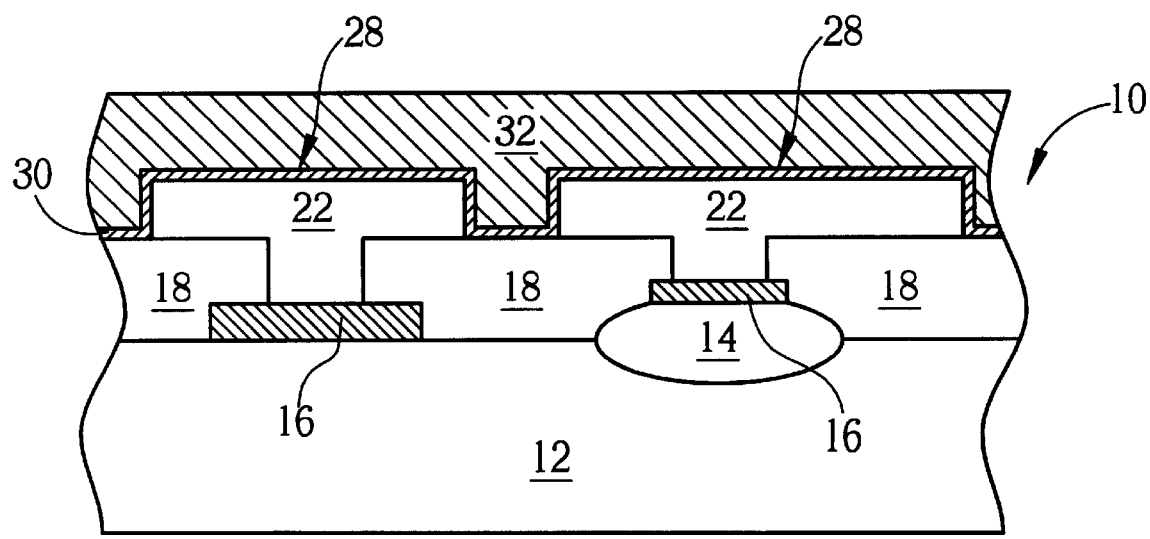
Figure 5:
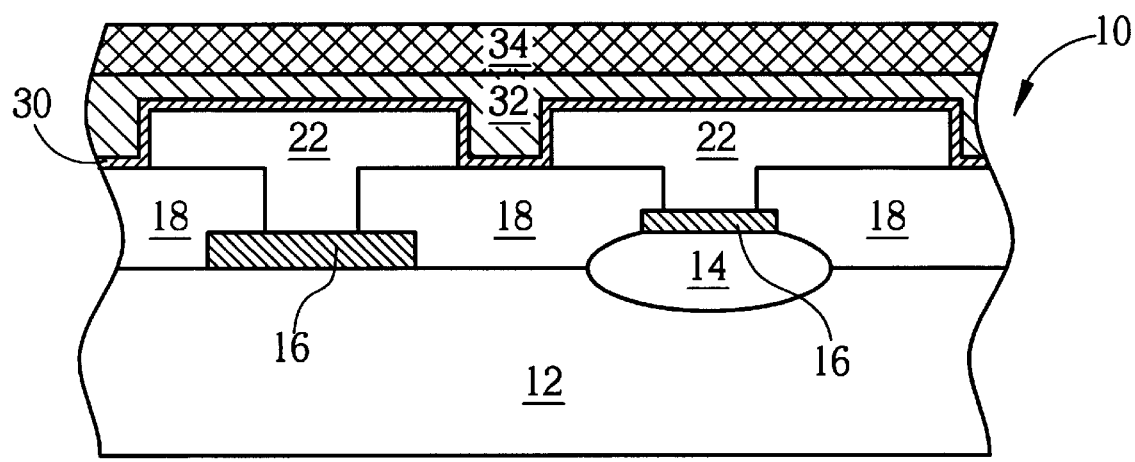
Figure 6:
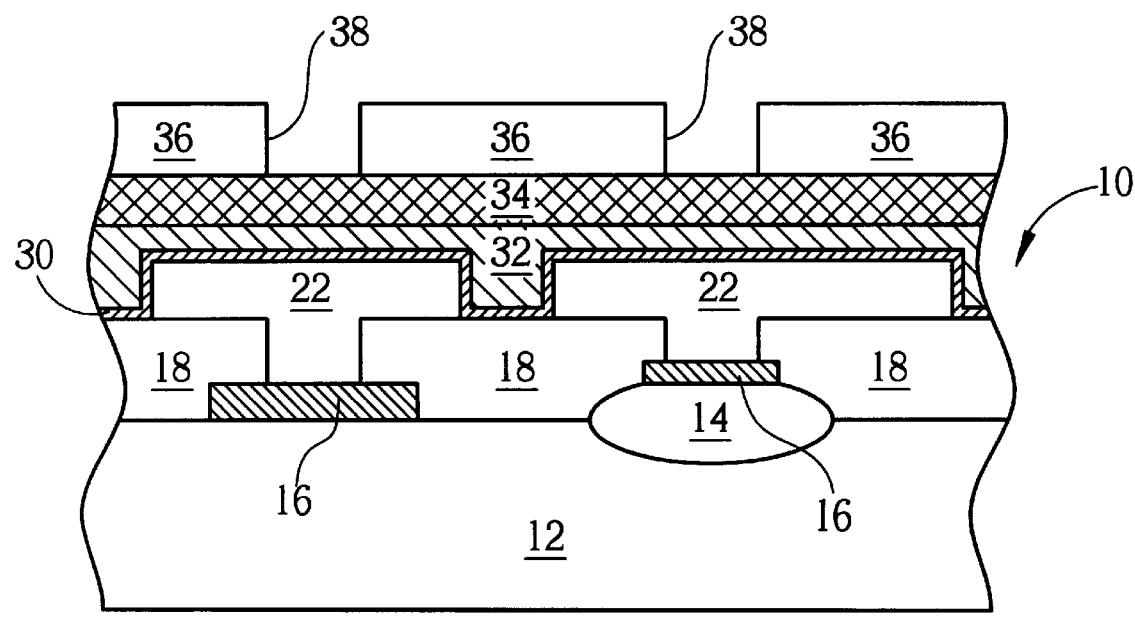
Figure 7:
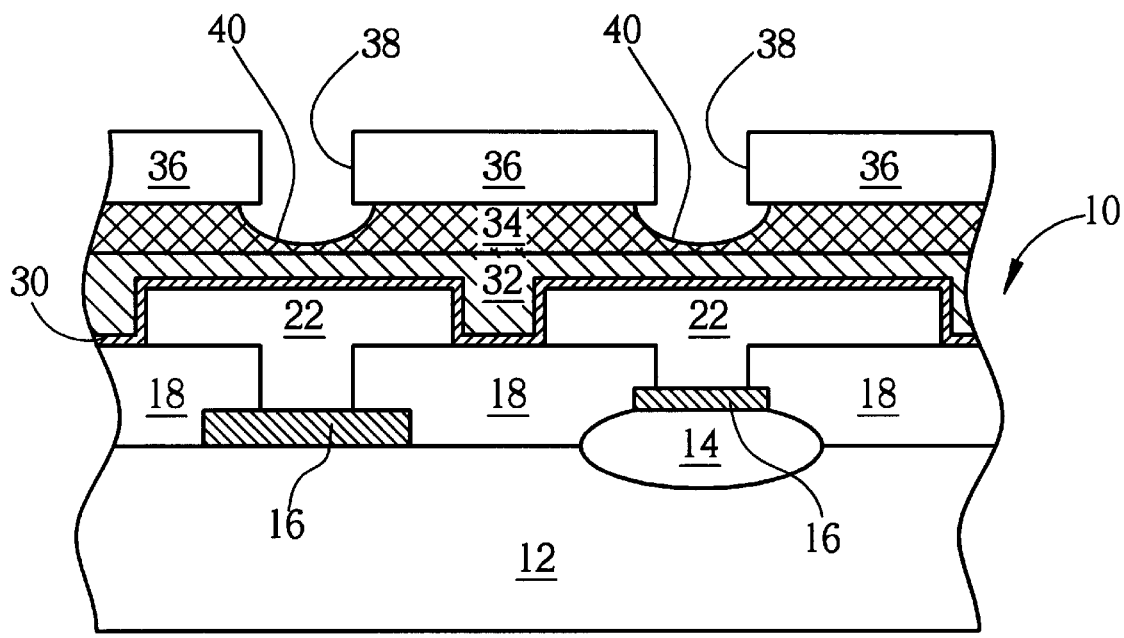
Figure 8:
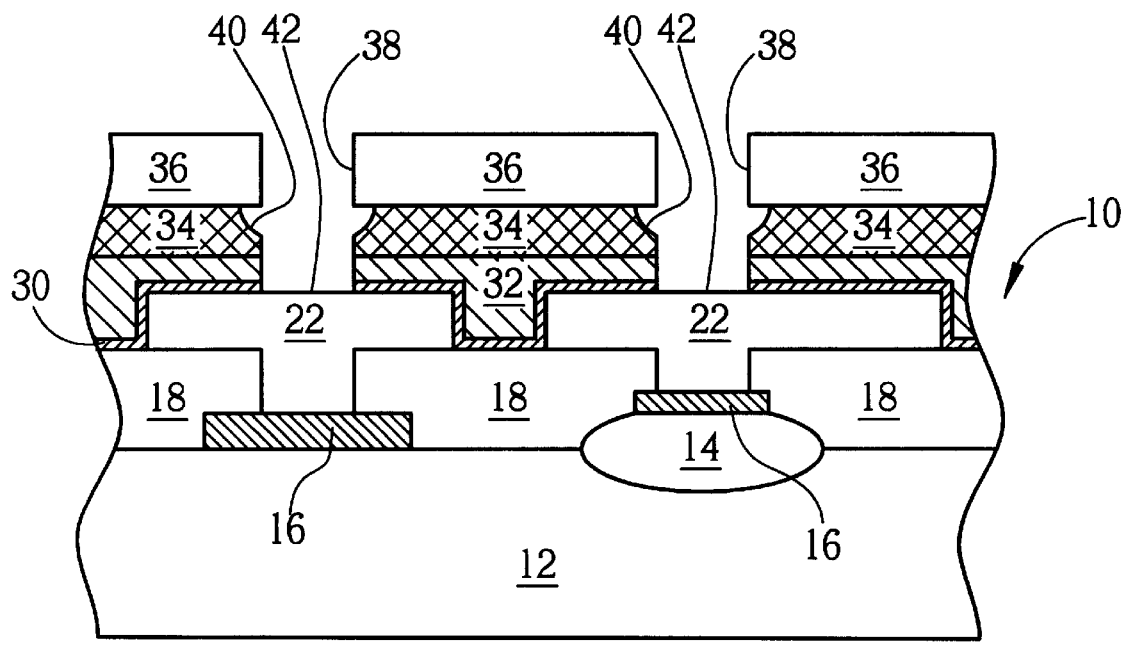
Figure 9:
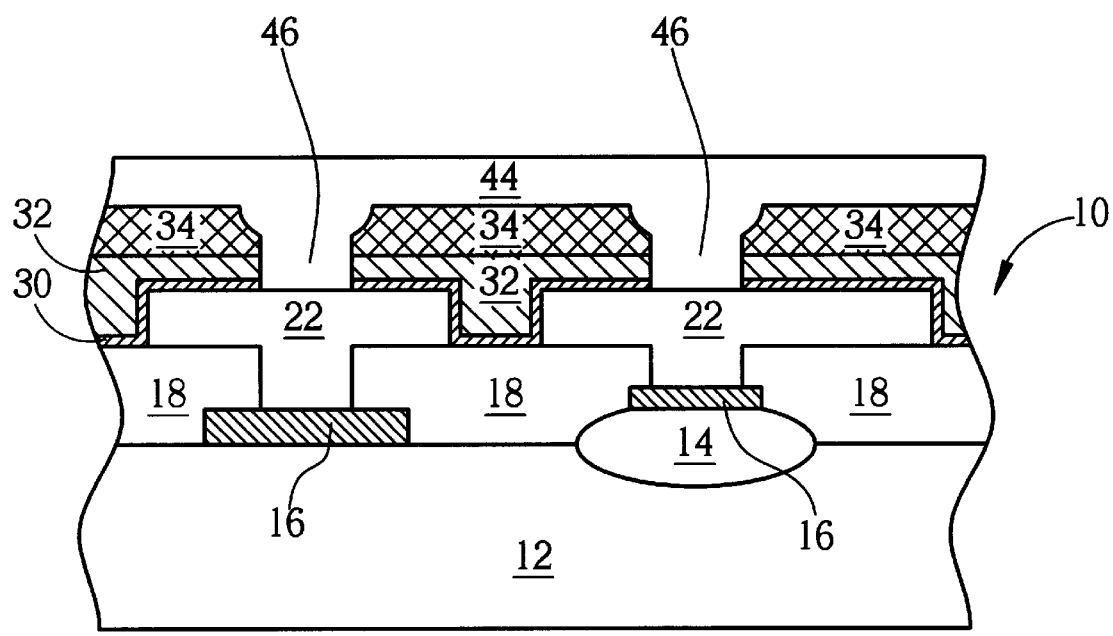
Figure 10:
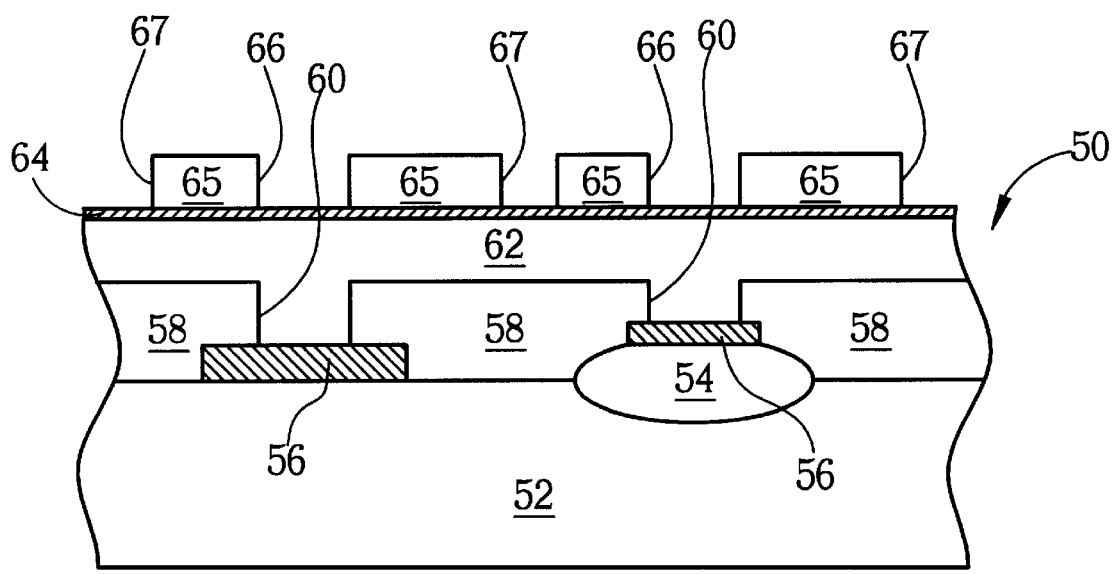
FIG. 10 to FIG. 18 are cross-sectional diagrams of a process of forming a via plug according to the present invention.

Please refer to FIG. 10 to FIG. 18. FIG. 10 to FIG. 18 are cross-sectional diagrams of the process of forming a via plug 74 of a semiconductor wafer 50 according to the present invention. The present invention method for forming a metal plug can be applied to form a via plug on the semiconductor wafer 50. As shown in FIG. 10, the semiconductor wafer 50 comprises a substrate 52, a field oxide layer 54 installed in a predetermined area on the surface of the substrate 52, two polysilicon layers 56 separately installed above the substrate 52 and the field oxide layer 54, a dielectric layer 58 installed on the surface of the substrate 52 and covering the polysilicon layers 56 to act as an insulation layer between the two polysilicon layers 56, two via holes 60 installed in the dielectric layer 58 above the polysilicon layers 56, and a conductive layer 62 installed over the dielectric layer 58 and filling the via holes 60. The conductive layer 62 is made of dopedpolysilicon, or aluminum, or an alloy of copper and aluminum.

Figure 11:
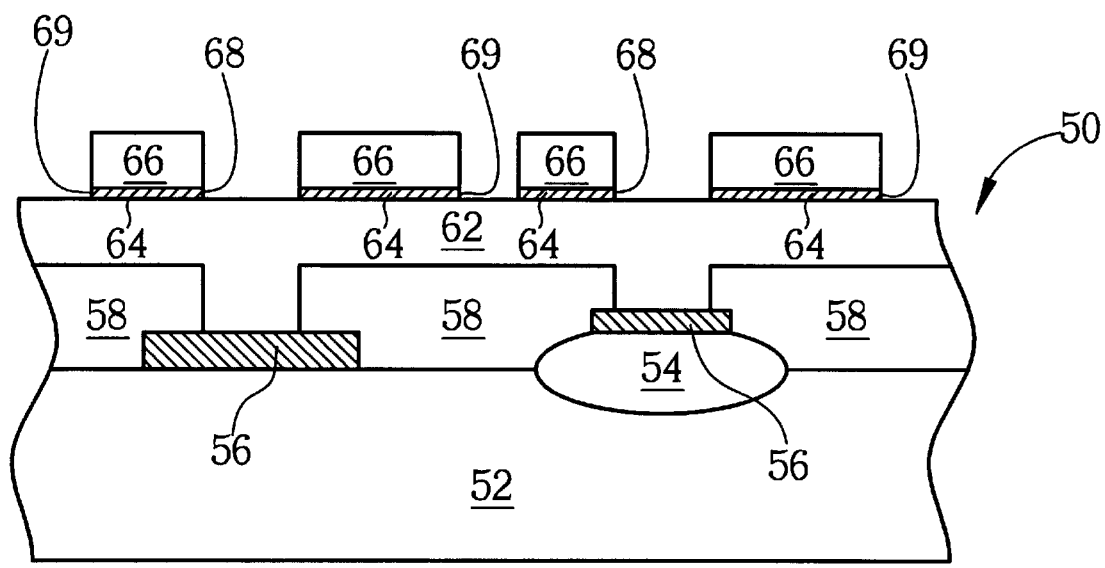

In the present invention method, a dielectric layer 64 of silicon dioxide with a thickness of less than 1000 Angstroms (Å) is first formed on the surface of the conductive layer 62. A photo-resist layer 65 is formed on the surface of the dielectric layer 64. A lithographic process forms a plurality of first openings 66 and second openings 67 in the photo-resist layer 65. As shown in FIG. 11, a dry etching process is then performed to remove the dielectric layer 64 which is under the first openings 66 and the second openings 67 so as to form a plurality of first holes 68 and second holes 69 that reach the conductive layer 62 to separately define the via plug 74 and the pattern of a conductive line. The conductive line is used as an underlayer metal line.

Figure 12:
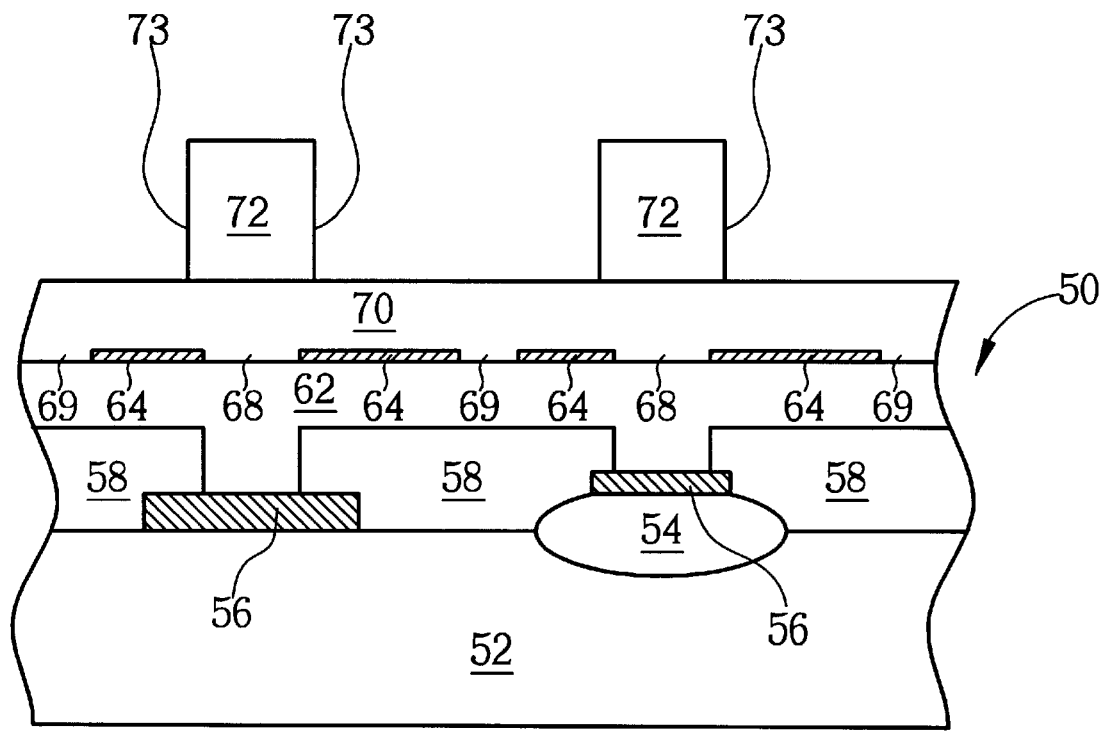
Figure 13:
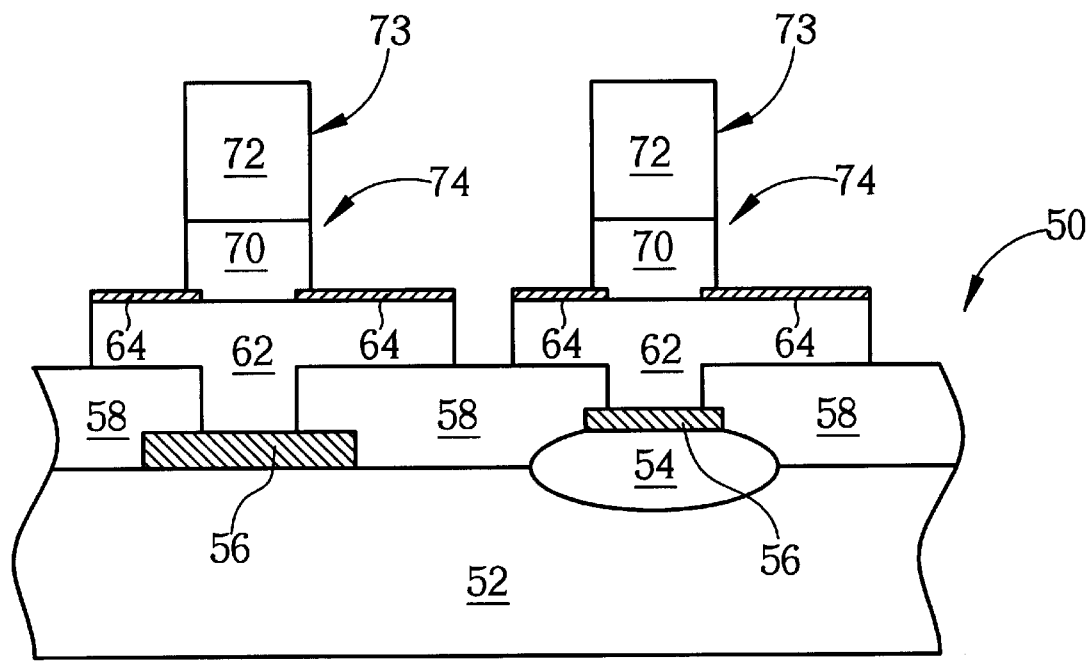

As shown in FIG. 12, the photo-resist layer 66 is completely removed. A conductive layer 70 is then formed on the surface of the dielectric layer 64 and conductive layer 62, filling the first holes 68 and the second holes 69. If the conductive layer 62 is made of doped polysilicon, the conductive layer 70 can be made of either aluminum or an alloy of copper and aluminum. If, however, the conductive layer 62 is made of aluminum or an alloy of copper and aluminum, then the conductive layer 70 is made of the same conductive material that is used in the conductive layer 62. A photo-resist layer 72 is then formed on the surface of the conductive layer 70, and a lithographic process is performed to form two masks 73 over the first holes 68 of the dielectric layer 64, defining the pattern of the via plug 74. As shown in FIG. 13, a dry etching process is performed, and the conductive layer 70 that is not covered by the masks 73 is removed down to the surface of the dielectric layer 64. The remaining conductive layer 70 under the mask 73 forms the via plug 74. Besides using the mask 73, the dielectric layer 64 is also used as a hard mask, causing the conductive layer 62 that is not covered by the mask 73 and the dielectric layer 64 to be removed down to the surface of the dielectric layer 58, thereby isolating the conductive layer 62 to form the lower level metal conductive lines. The photo-resist layer is then completely removed.

Figure 14:
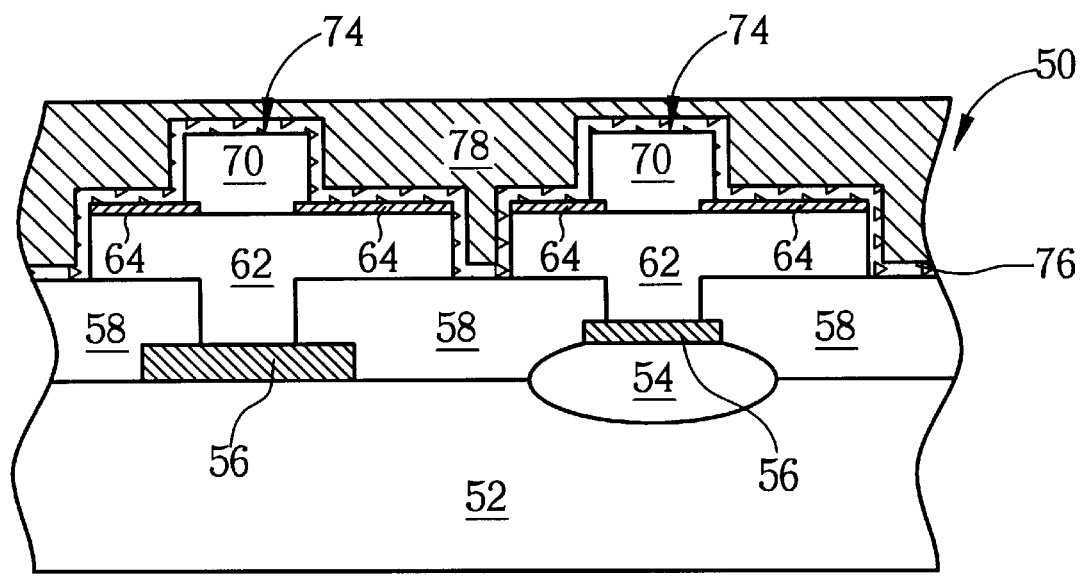
Figure 15:
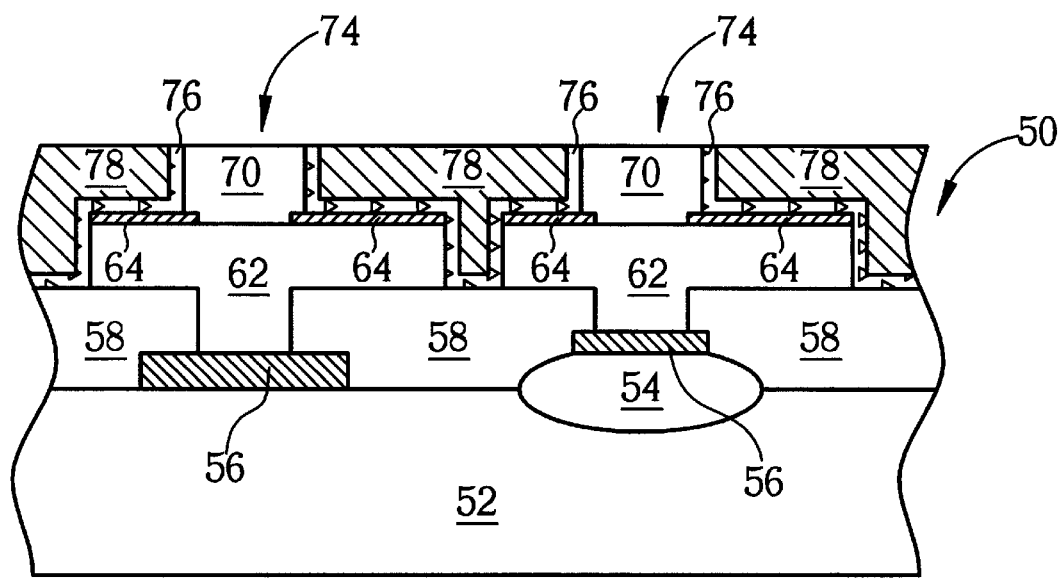
Figure 16:
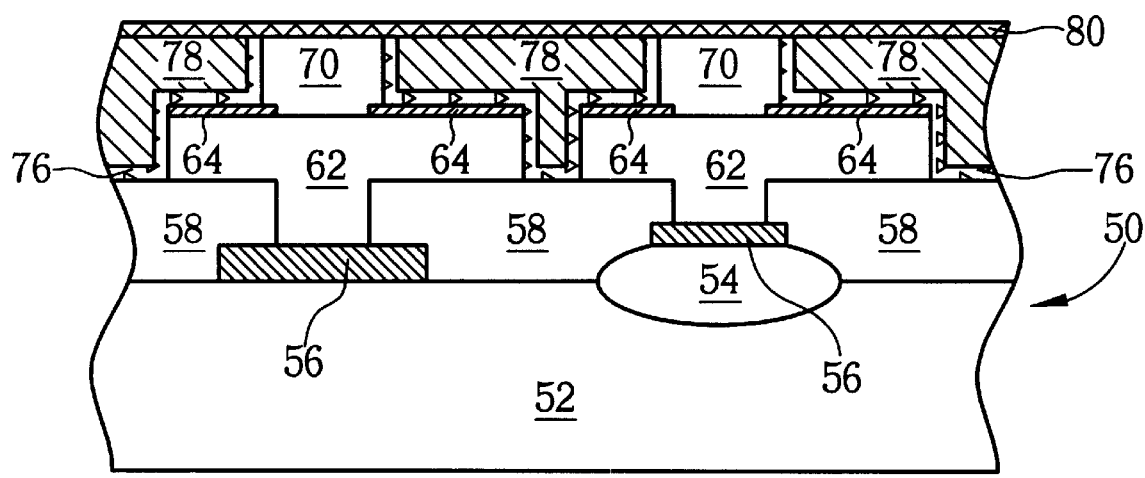

As shown in FIG. 14, after forming the patterns of the via plug and the lower level metal conductive lines, a planarization process is performed to fill the gaps on the surface of the semiconductor wafer 50. The planarization process involves first performing a plasma enhanced chemical vapor deposition (PECVD) process to form a dielectric layer 76 made of silicon dioxide on the surface of the semiconductor wafer 50. The dielectric layer 76 covers the surface and walls of the conductive layers 62, 70. A spin-on glass (SOG) process is then performed to form an SOG layer 78 on the surface of the dielectric layer 76 to fill the gaps of the conductive layers 62, 70. As shown in FIG. 15, an etch back process is performed to uniformly remove part of the SOG layer 78 and the dielectric layer 76 until the surface of the SOG layer 78 and the surface of the via plug are level. As shown in FIG. 16, after the etch back process, a plasma enhanced chemical vapor deposition (PECVD) process forms a dielectric layer 80 on the surface of the semiconductor wafer 50 to complete the planarization process of the semiconductor wafer 50. The dielectric layer 76, the SOG layer 78 and the dielectric layer 80 form an inter-metal dielectrics (IMD) layer that is used as the insulation layer between the via plug 74 and the lower level metal conductive lines. This also forms a sandwich structure that guarantees the physical and chemical characteristics of the SOG layer 78.

Figure 17:
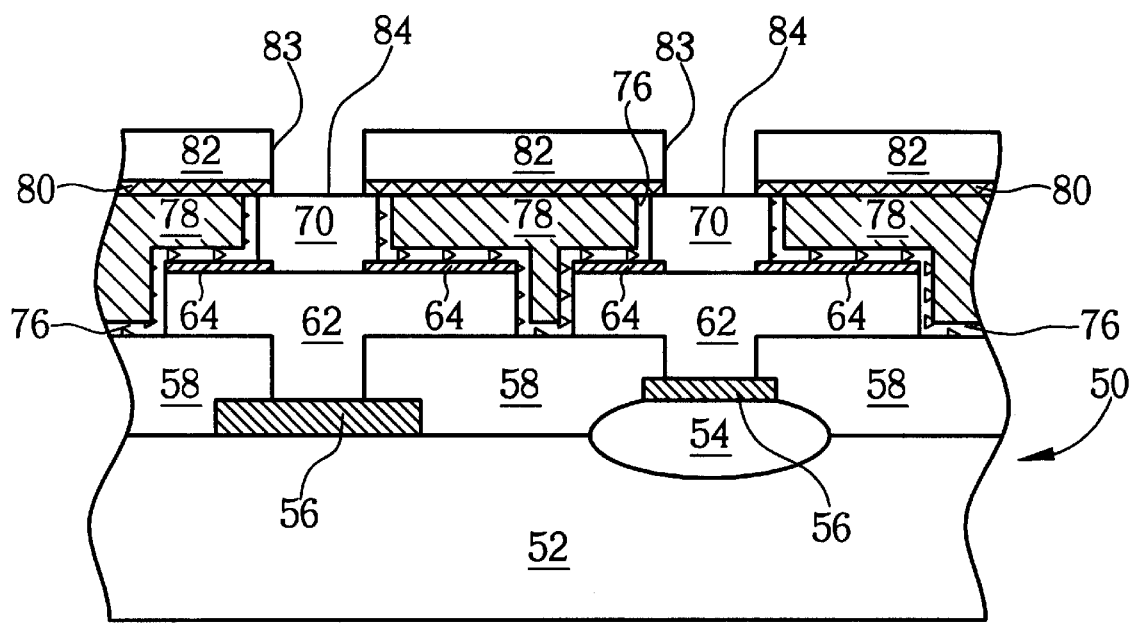
Figure 18:
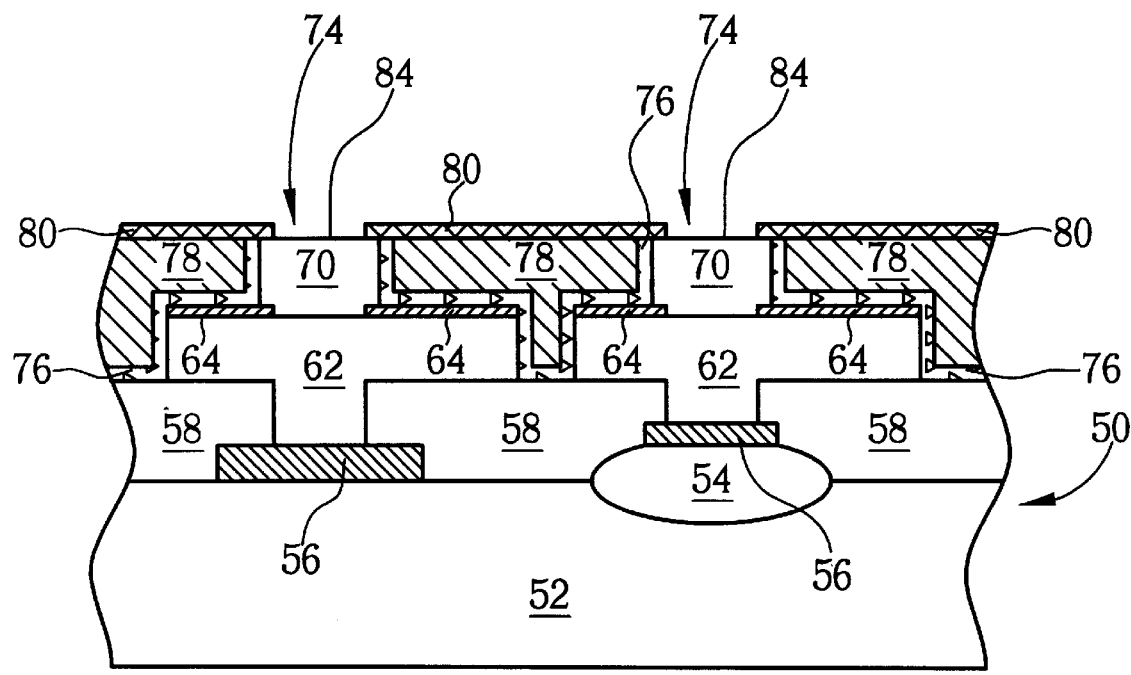

As shown in FIG. 17, a photo-resist layer 82 is formed on the surface of the dielectric layer 80. A lithographic process forms two openings 83 in the photo-resist layer 82. A dry etching process etches downward along the opening 83 to form a via hole 84 as a path connecting to the upper layer metallic line (not shown). As shown in FIG. 18, the photo-resist layer 82 is completely removed to complete the via plug 74 that connects the lower layer metallic line and the follow-up metallic line.

In short, the present invention method for forming a via plug 74 is to first form the conductive layers 62, 70, and then define the pattern of the via plug 74 and the lower layer metallic lines simultaneously. The via plug 74 is formed at the same time as the lower layer metallic lines. Finally, an inter-metal dielectric layer is formed, and a planarization process is performed. The present invention method can also be applied to a contact plug that connects each terminal port of a metal oxide semiconductor (MOS) transistor to a metallic layer. In other words, when forming a contact plug, first form a conductive layer, then define the pattern of the contact plug, and finally form the dielectric layer, completing the contact plug.

Figure 19:
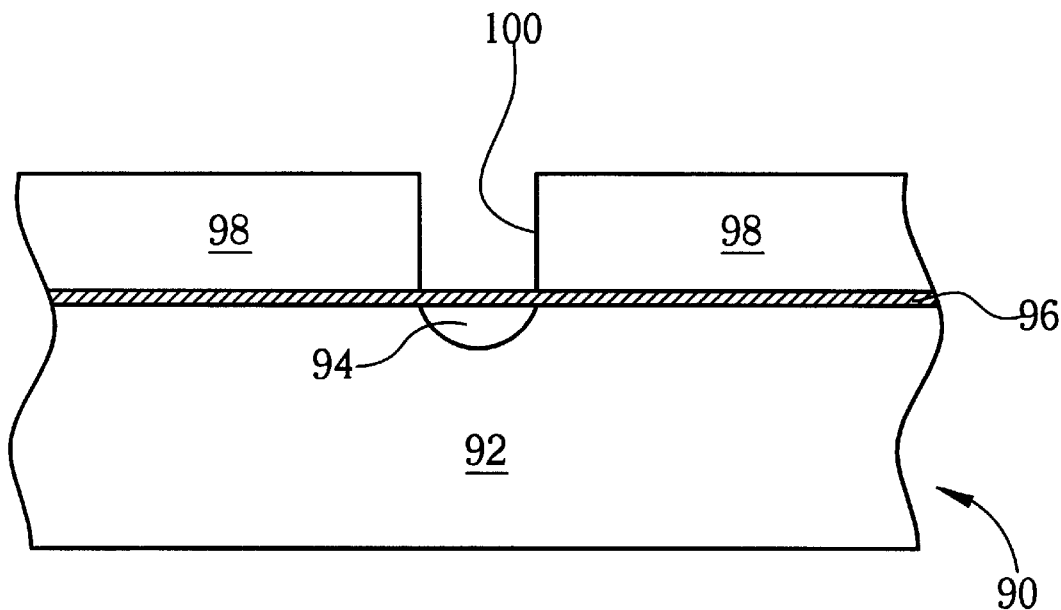
FIG. 19 to FIG. 26 are cross-sectional diagrams of a process of forming a metal plug of an alternative embodiment according to the present invention.
Figure 20:
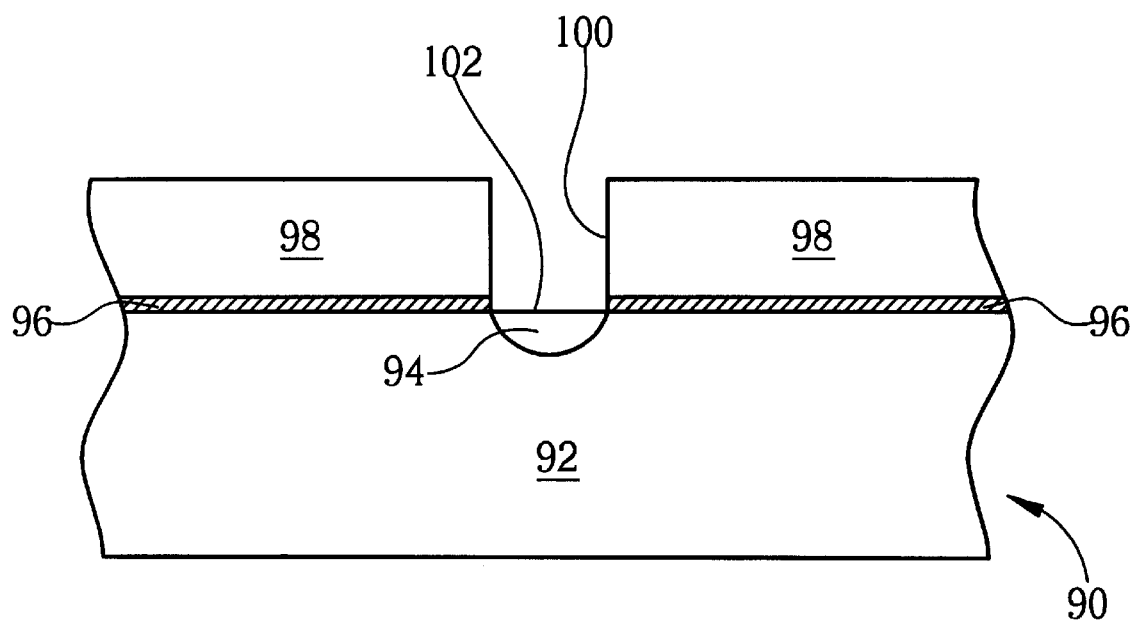

Please refer to FIG. 19 to FIG. 26. FIG. 19 to FIG. 26 are cross-sectional diagrams of the process of forming a metal plug 108 of an alternative embodiment according to the present invention. The metal plug 108 of the alternative embodiment is used to connect each terminal port of a MOS transistor and each metallic layer with a contact plug. As shown in FIG. 19, the semiconductor wafer 90 comprises a substrate 92, and at least one conductive layer 94 installed in a predetermined area on the surface of the substrate 92. The conductive layer 94 is made of doped polysilicon or silicide. In the present invention method of forming the metal plug 108, a dielectric layer 96 is first formed on the surface of the substrate 92. The dielectric layer is made of silicon dioxide and has a thickness of less than 1000 Å. Then, a photo-resist layer 98 is formed on the surface of the dielectric layer 96. A lithographic process forms an opening 100 in the photo-resist layer 98 above the first conductive layer 96. As shown in FIG. 20, a dry etching process removes the dielectric layer 96 that is under the opening 100 of the photo-resist layer 98 to form a hole 102 to the conductive layer 94.

Figure 21:
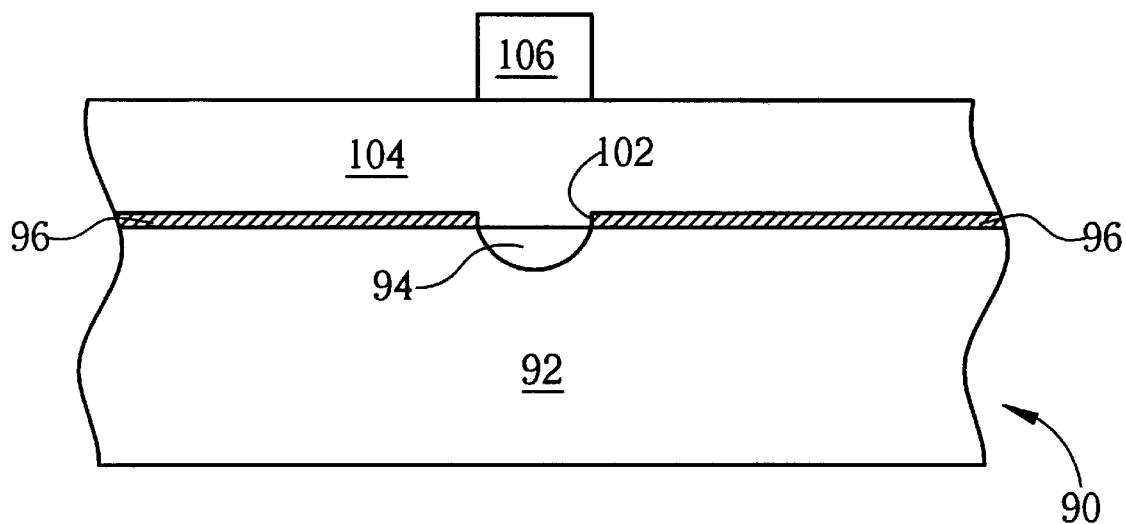
Figure 22:
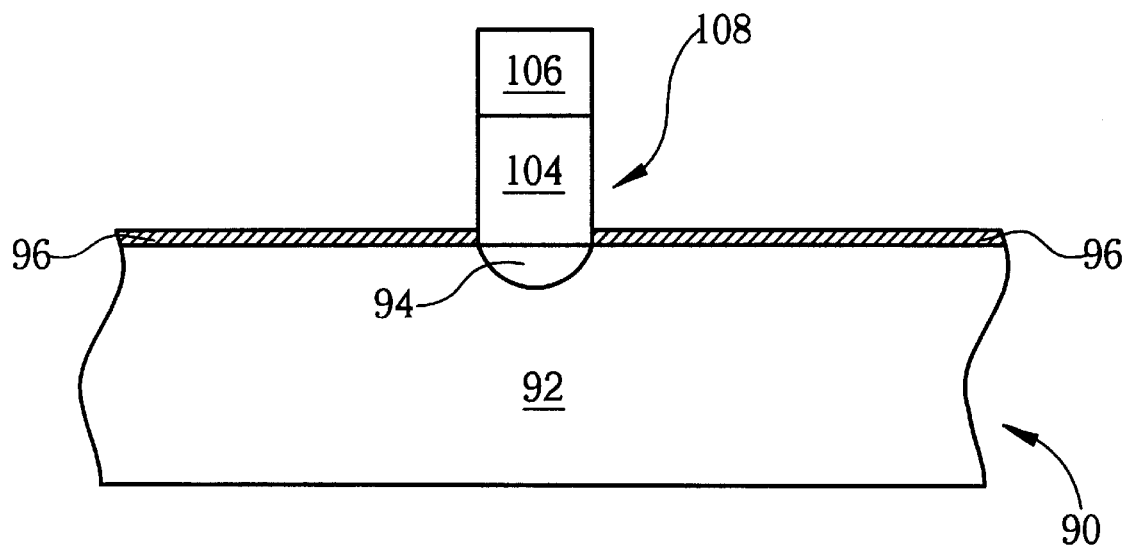

As shown in FIG. 21, the photo-resist layer 98 is completely removed. A conductive layer 104, which is made of doped polysilicon, aluminum or an alloy of aluminum and copper, is uniformly formed over the dielectric layer 96 and the hole 102. A photo-resist layer 106 is formed on the surface of the conductive layer 104. A lithographic process forms a mask by using the photo-resist layer 106 positioned above the hole 102 of the dielectric layer 96 to define the position of the metal plug 108. As shown in FIG. 22, a dry etching process removes the conductive layer 104 that is not covered by the mask. The remaining conductive layer 104 under the mask forms the metal plug 108. Finally, the photo-resist layer 106 is completely removed to complete the metal plug that is used as a contact plug.

Figure 23:
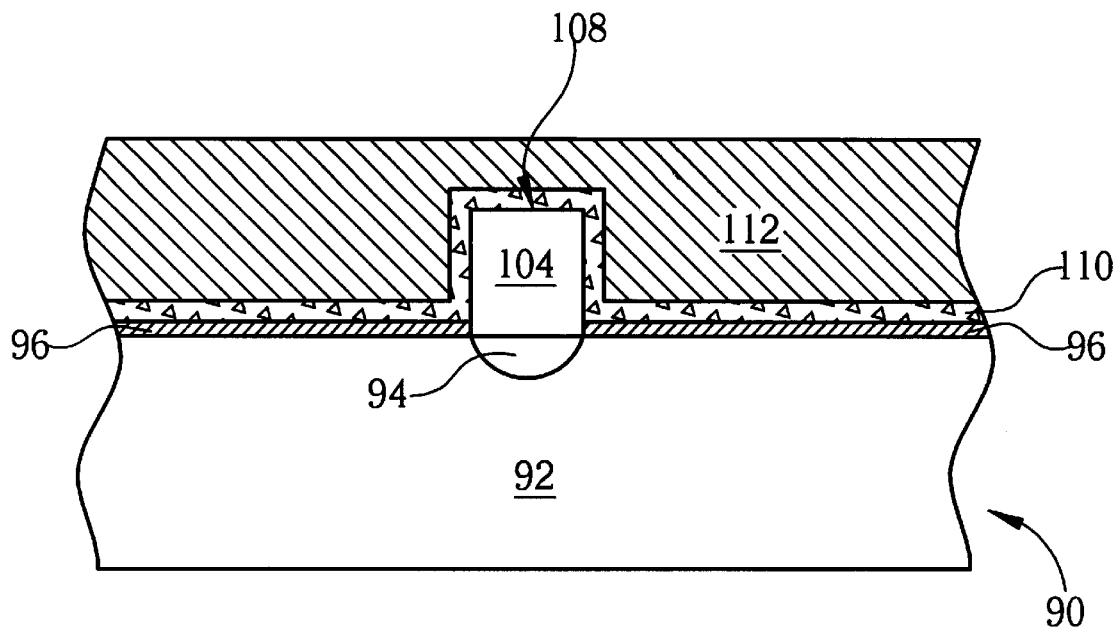
Figure 24:
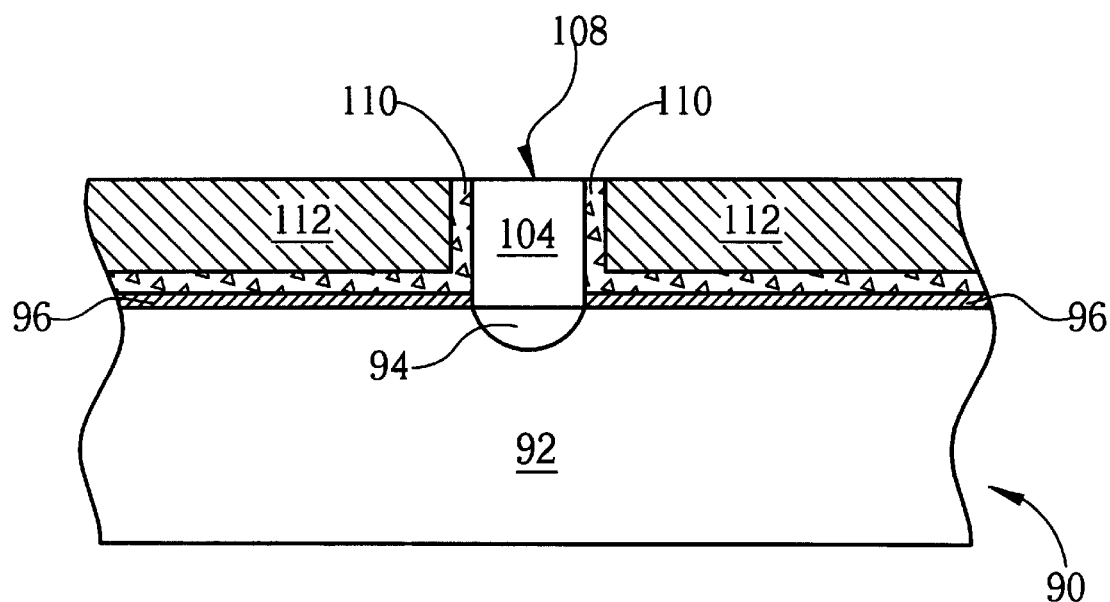

As shown in FIG. 23, after forming the metal plug 108, a planarization process is performed to fill the gaps on the surface of the semiconductor wafer 90 and to form an insulation layer in the periphery of the metal plug 108. The planarization process involves first performing a plasma enhanced chemical vapor deposition (PECVD) process to form a dielectric layer 110 made of silicon dioxide (SiO$_2$) on the surface of the semiconductor wafer 10 to cover the surface and walls of the conductive layer 104. Then, a spin-on glass (SOG) process is performed to form an SOG layer 112 on the surface of the dielectric layer 110. As shown in FIG. 24, an etch back process uniformly removes part of the SOG layer 112 and the dielectric layer 110 until the surface of the SOG layer 112 and surface of the metal plug are level.

Figure 25:
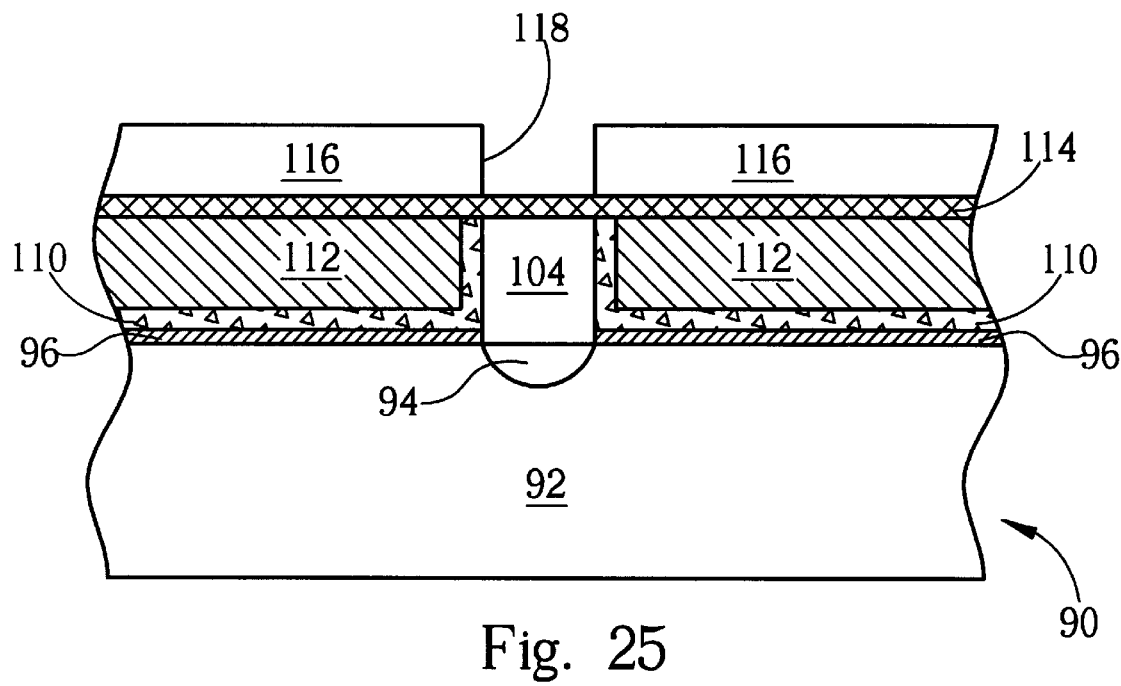
Figure 26:
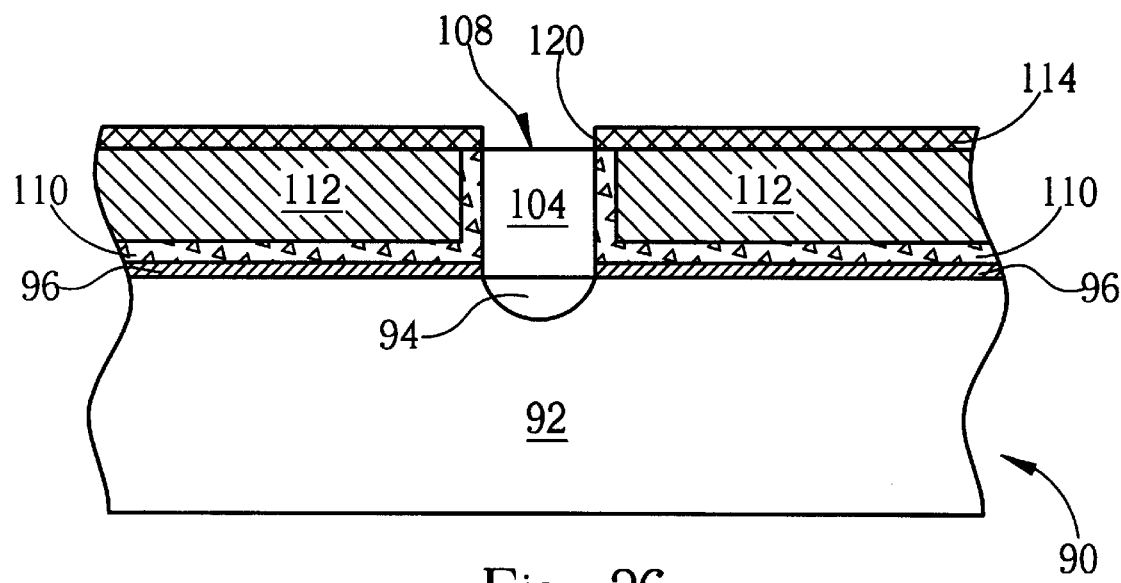

As shown in FIG. 25, after the etch back process, a plasma enhanced chemical vapor deposition (PECVD) process forms a dielectric layer 114 on the surface of the semiconductor wafer 90 to complete the planarization process of the semiconductor wafer 90. The dielectric layer 110, the SOG layer 112 and the dielectric layer 114 are used as the insulation layer between the metal plug and follow-up metallic connecting lines (not shown). They also form a sandwich structure that guarantees the physical and chemical characteristics of the SOG layer 112. A photo-resist layer 116 is formed on the surface of the dielectric layer 114. A lithographic process forms an opening 118 in the photo-resist layer 116. As shown in FIG. 26, a dry etching process etches the dielectric layer 114 along the opening 118 to form a via hole 120 as a path for connecting the follow-up metallic conductive lines. Finally, the photo-resist layer 116 is completely removed to complete the metal plug 108 that connects the conductive layer 94 with the follow-up metallic conductive lines.

In both the first and second embodiments of the present invention, the method of forming the via plug 74 is to first form a conductive layer 62. A dielectric layer 64 is then formed, and a pattern is defined that is a combination of both the via plug and the lower level metal conductive lines. A conductive layer is formed on the dielectric layer 64 to define the pattern of the via plug 74 on the conductive layer 70. The via plug 74 is formed, using the dielectric layer 64 as a hard mask of the conductive layer 62, to complete the lower level metal conductive lines. Finally, the inter-dielectric layer is formed and a planarization process is performed. The present invention method forms the lower level metal conductive lines simultaneously with the via plug 74. Regarding the present invention method of forming the metal plug 108, it also involves first forming a conductive layer 74. A pattern of the metal plug 108 is defined on the conductive layer 74, and then the metal plug 108 is formed from an etching process. Finally, the insulation layer is formed and a planarization process is performed. Hence, the quality of the metal plug 108 is unaffected by either the insulation layer or the planarization process.

The advantages of the present invention method for forming the via plug 74 and the metal plug 108 are as follows:

(1) In the present invention, the method of forming the via plug 74 and the method of forming the metal plug 108 both involve first forming the via plug 74 or the metal plug 108, then forming the inter-metal dielectrics layer or the insulation layer. It does not require the formation of a large aspect ratio via hole. Hence, the present invention method does not need to perform a wet etching process to form the via hole with a special shape, and so avoids the problems associated with filling the via hole.

(2) The present invention method of forming the via plug 74 defines the pattern of the via plug 74 and the lower level metal conductive lines simultaneously, thus avoiding the problem of via misalignment. Furthermore, because the present invention method does not have to form a via hole with a wineglass-shaped structure, it avoids the phenomenon of short-circuiting with other components and increases the misalignment tolerance of the via hole.

(3) The thickness of the dielectric layers 64, 96 formed by the present invention method is less than 1000 Å, so the metal that fills the via hole or the hole has good step coverage abilities. It achieves the same effect as the tungsten plug, but the resistance, cost and the production time are all less than the method of forming the tungsten plug.

(4) Because the thickness of the dielectric layers 64, 96 is less than 1000 Å, when forming the first hole 68, the second hole 69 and the hole 102, the polymers generated when etching can be completely removed and so do not affect the follow-up filling metal.

(5) The present invention method of forming the via plug 74 and the metal plug 108 involves first forming a metallic layer, then forming the SOG layers 78, 112. The SOG layers 78, 112 are completely enclosed by the upper and lower dielectric layers, so they avoid moisture absorption and leakage, preventing the problems of poison vias.

(6) The present invention method uses aluminum, or an alloy of aluminum and copper, to form the metal plug, rather than tungsten which has a higher resistance. Consequently, there is no need for a titanium nitride (TiN) layer or an alloy layer of titanium and tungsten, both of which have a high resistivity. Hence, the via plug 74 and the metal plug 108 formed by the present invention method have less electrical resistance than that of the tungsten plug.

Compared to the prior art method of forming the metal plug, the present invention of forming the metal plug first defines the pattern of the metal plug, then forms the inter-metal dielectrics layer. So, the present invention method of forming the metal plug improves the problem of filling metal into gaps, and avoids the problem of poison vias and the problem of via misalignment. Furthermore, the present invention method reduces the resistance of the metal plug and also reduces both the production time and cost, if used over the prior art tungsten plug.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a via plug on a semiconductor wafer, the semiconductor wafer comprising a first conductive layer, the method comprising the following steps:

forming a dielectric layer with a thickness less than 1000 angstrom (Å) on the surface of the first conductive layer;

forming a plurality of first holes and second holes above the first conductive layer which pass through the dielectric layer and reach the first conductive layer wherein the first holes define the positions of the metal plugs on the first conductive layer and the second holes define the pattern of a metal conductive line;

forming a second conductive layer uniformly over the dielectric layer which fills the holes;

forming a mask on the surface of the second conductive layer above each of the first holes;

performing a second dry etching process to remove the second conductive layer which is not covered by the masks and remove the first conductive layer which is not covered by the masks or the dielectric layer, the remaining second conductive layer under each of the masks being the via plug, the remaining first conductive layer under the masks and the dielectric layer being the metal conductive line; and removing the mask completely.

2. The method of claim 1 wherein the first conductive layer is made of doped poly-silicon and the second conductive layer is made of aluminum or an alloy of aluminum and copper.

3. The method of claim 1 wherein the first and second conductive layers are made of aluminum or an alloy of aluminum and copper.

4. The method of claim 1 wherein the dielectric layer is made of silicon dioxide.

5. The method of claim 1 wherein the first and second holes on the dielectric layer are formed by the following steps:

forming a first photo-resist layer on the surface of the dielectric layer;

performing a first lithographic process to form a plurality of openings over the first photo-resist layer above the dielectric layer;

performing a first dry etching process to remove the dielectric layer under the openings down to the first conductive layer so as to form the first and second holes; and removing the first photo-resist layer completely.

6. The method of claim 7 wherein the masks over the surface of the second conductive layer are formed according to the following steps:

forming a second photo-resist layer on the surface of the second conductive layer;

performing a second lithographic process to form the mask by using the second photo-resist layer positioned above the hole of the dielectric layer.

* * * * *